United States Patent
Hsu

(10) Patent No.: US 12,322,988 B2
(45) Date of Patent: Jun. 3, 2025

(54) DEVICE AND METHOD FOR ACHIEVING DYNAMIC CHARGING AND BALANCE OF BATTERY CELLS AND RECHARGEABLE BATTERY DEVICE

(71) Applicant: PROLIFIC TECHNOLOGY INC., Taipei (TW)

(72) Inventor: Chia-Chang Hsu, Hsinchu County (TW)

(73) Assignee: PROLIFIC TECHNOLOGY INC., Taipei (TW)

( * ) Notice: Subject to any disclaimer, the term of this patent is extended or adjusted under 35 U.S.C. 154(b) by 683 days.

(21) Appl. No.: 17/692,187

(22) Filed: Mar. 11, 2022

(65) Prior Publication Data

US 2022/0329079 A1    Oct. 13, 2022

(30) Foreign Application Priority Data

Apr. 7, 2021    (TW) .................................. 110112462

(51) Int. Cl.

| | |
|---|---|
| *G01R 31/3835* | (2019.01) |
| *G01R 31/396* | (2019.01) |
| *H01M 10/42* | (2006.01) |
| *H01M 10/44* | (2006.01) |
| *H01M 10/48* | (2006.01) |
| *H02J 7/00* | (2006.01) |

(52) U.S. Cl.
CPC ........ *H02J 7/0014* (2013.01); *G01R 31/3835* (2019.01); *G01R 31/396* (2019.01); *H01M 10/425* (2013.01); *H02J 7/0029* (2013.01); *H02J 7/007182* (2020.01); *H01M 2010/4271* (2013.01); *H01M 10/441* (2013.01); *H01M 10/482* (2013.01)

(58) Field of Classification Search
None
See application file for complete search history.

(56) References Cited

U.S. PATENT DOCUMENTS

| | | | |
|---|---|---|---|
| 2012/0091966 A1* | 4/2012 | Mori | ..................... H01M 10/44 320/160 |
| 2014/0117921 A1* | 5/2014 | Suomela | ............. H02J 7/00047 320/103 |
| 2019/0227585 A1* | 7/2019 | Tiedemann | .............. H02H 9/04 |
| 2022/0289067 A1* | 9/2022 | Adegbohun | ...... H01M 10/6554 |

FOREIGN PATENT DOCUMENTS

CN          101826737 A   *   9/2010

* cited by examiner

*Primary Examiner* — Julian D Huffman
*Assistant Examiner* — Sadia Kousar

(57) ABSTRACT

A device for achieving dynamic charging and balance of battery cells is disclosed. The device is configured for monitoring a plurality of battery voltages from a plurality of battery cells in a multi-cell battery pack. In case of a battery voltage difference between two of the battery cells being greater than a pre-determined voltage difference, the device generates a plurality of balance charging currents for charging the battery cells. In which, each of the balance charging currents is calculated based on remaining charge time, measured battery voltage, and rated battery capacity. Thus, in a charge cycle, one balance charging current for charging the battery cell with low battery voltage is designed to be greater than another one balance charging current for charging the battery cell with high battery voltage. Consequently, elimination of the battery voltage difference existing between any two of the battery cells is achieved.

7 Claims, 7 Drawing Sheets

DEVICE AND METHOD FOR ACHIEVING DYNAMIC CHARGING AND BALANCE OF BATTERY CELLS AND RECHARGEABLE BATTERY DEVICE

BACKGROUND OF THE INVENTION

1. Field of the Invention

The present invention relates to the technology field of multi-cell battery packs, and more particularly to a device and method for achieving dynamic charging and balance of battery cells.

2. Description of the Prior Art

With continuous innovation and development of high-power cordless electrical products such as cordless vacuum cleaner, cordless power tool and robot vacuum cleaner, multi-cell battery packs do therefore receive wide use in power supply of the high-power cordless electrical products. FIG. 1 shows a stereo diagram of a conventional multi-cell battery pack. As FIG. 1 shows, the multi-cell battery pack 1a principally comprises: a plurality of battery cells 11a, a plurality of battery holders 12a and a battery management circuit 13a. In practical use, the multi-cell battery pack 1a is accommodated in a housing so as to form a rechargeable battery device, and then the rechargeable battery device is connected to a main body of a cordless electrical product (e.g., cordless vacuum cleaner) for supplying power to a motor and/or electronic components that are disposed in the main body.

It should be known that, besides being widely used in power supply of the high-power cordless electrical products, the multi-cell battery pack can also be applied in manufacture of the battery system of electric vehicle and electric scooter. When the rechargeable battery device using the multi-cell battery pack 1a is in a low capacity state or is going to run down, it needs to use a charging device to charge the rechargeable battery device. During the charging of the rechargeable battery device, the charging device generates a constant current to charge each of the plurality of battery cells 11a in the multi-cell battery pack 1a, and then stops the generation of the constant current until every battery cell's battery voltage reaches a target battery voltage. However, during the charging of the rechargeable battery device, inherent differences between the battery cells 11a cause that the lower-capacity battery cell 11a to reach end of charge first. As a result, in spite of the fact that an indicator light reveals that the rechargeable battery device is fully charged, the battery cells 11a are still not charged to have the same capacity. Moreover, inherent differences in the battery cells 11a also cause that the battery cells 11a not exhibit the same charging/discharging efficiency even if the charging device utilizes constant charging/discharging current to apply a battery charging/discharging process to the rechargeable battery device.

Battery engineers certainly know that, the lithium-ion battery cell 11a commonly has a rated battery voltage of 3.4V~4.2V, and possesses higher energy density, such that the rechargeable batteries are typically configured as a series connected pack (i.e., the multi-cell battery pack 1a) comprising a plurality of lithium-ion battery cells 11a. However, the lithium-ion battery cell 11a is known showing a number of drawbacks in practical use. For example, over discharging of one or more lithium-ion battery cells 11a would induce unbalance between all of the lithium-ion battery cells 11a in the multi-cell battery pack 1a, thereby eventually causing battery voltage/capacity differences occur between any two of the lithium-ion battery cells 11a. In view of that, the battery management circuit 13a is commonly designed to have functions of overcharge protection, over-discharge protection and short circuit protection.

By such arrangement, when some of the battery cells 11a are soon charged to reach a (upper) threshold voltage of overcharge protection of having high batter voltage before the charging, the charging of those battery cells 11a is stopped by the battery management circuit 13a. On the contrary, in case of some of the battery cells 11a being soon discharged to reach a (lower) threshold voltage of over-discharge protection because of having low batter voltage before the discharging, the discharging of those battery cells 11a is stopped by the battery management circuit 13a. As a result, unbalance between the battery cells 11a of the multi-cell battery pack 1a occurs, eventually causing that the time spent by the charging device for accomplishing the charging of the rechargeable battery device be shortened time after time. Thus, battery voltage unbalance of the battery cells 11a becomes the major factor causing use time of the multi-cell battery pack 1a gets shorter and shorter.

For improving the above-mentioned drawbacks of the conventional multi-cell battery pack 1a, U.S. Pat. No. 8,035,343 discloses a method for balancing cells in a battery pack. In which, there is a battery cell balancing module comprising a plurality of voltage monitoring units and a plurality of battery cell balancing units integrated in a battery management circuit (like 13a as shown in FIG. 1), and each of the plurality of voltage monitoring units and each of the plurality of battery cell balancing units are both electrically connected to one battery cell 11a. During discharging of the multi-cell battery pack 1a, battery voltage of each of the battery cells 11a in the multi-cell battery pack 1a is immediately detected by the voltage monitoring unit. Moreover, in case of the multi-cell battery pack 1a being charged, the battery cell balancing unit is enabled to accomplish a voltage balance between the battery cells 11a in the multi-cell battery pack 1a.

According to the disclosures of U.S. Pat. No. 8,035,343, the charging device firstly outputs a maximum charging current (e.g., 450 mA) at the beginning of the charging of the multi-cell battery pack 1a, such that the battery management circuit taking the maximum charging current as a first charging current to charge each of the battery cells 11a, and the voltage monitoring units detect the battery voltage of the battery cells 11a during the battery cells 11a being charged by the first charging current. Subsequently, in case of at least one battery cell's battery voltage reaching a target battery voltage (e.g., 3.6V), the battery management circuit down-regulates the first charging current by a pre-determined decrement, thereby converting the first charging current to a second charging current. After that, the battery management circuit utilizes the second charging current to charge each of the battery cells 11a, and then converts the second charging current to a third charging current in case of at least one battery cell's battery voltage reaching the target battery voltage. On the analogy of such charging current regulation, the maximum charging current (i.e., first charging current) is eventually converted to a minimum charging current (e.g., 45 mA or 140 mA) of the charging device.

Briefly speaking, the method disclosed by the U.S. Pat. No. 8,035,343 is designed for accomplishing a battery voltage balance between the battery cells 11a in the multi-cell battery pack 1a in multi-time charging cycles. Please refer to following Table (1), which records maximum battery voltage and minimum battery voltage of the battery cells 11a in the multi-cell battery pack 1a in each of the charging cycles. From the Table (1), it is found that, the higher the battery voltage difference between two of the battery cells 11a exhibits, the more the number of times of charging cycles gets. As explained in more detail below, the forgoing target battery voltage is 4.25V, meaning that the battery cell 11a is fully charged in case of the battery voltage thereof reaching 4.25V.

TABLE 1

| Charging cycle | Maximum battery voltage of battery cell 11a (Vcell_MAX) | Minimum battery voltage of battery cell 11a (Vcell_MIN) | Charge time |
|---|---|---|---|
| Run1 (First time) | 3.95 V | 3.60 V | 1.35 hours |
| Run2 (Second time) | 3.80 V | 3.40 V | 2.86 hours |
| Run3 (Third time) | 3.75 V | 3.40 V | 3.32 hours |
| Run4 (Fourth time) | 3.70 V | 3.40 V | 3.53 hours |
| Run5 (Fifth time) | 3.65 V | 3.40 V | 3.93 hours |
| Run6 (Sixth time) | 3.60 V | 3.40 V | 4.42 hours |
| Run7 (Seventh time) | 3.55 V | 3.40 V | 4.7 hours |
| Run8 (Eighth time) | 3.50 V | 3.40 V | 4.8 hours |

It has been known that, the management circuit 13a used in the multi-cell battery pack 1a (as shown in FIG. 1) commonly further has a function of charge time protection. During the charging of the multi-cell battery pack 1a, the management circuit 13a stops charging the multi-cell battery pack 1a in case of a total charge time of the multi-cell battery pack 1a being over a pre-determined charge time (e.g., 6-12 hours, by intensity of the charging current). However, experiment data of the multi-cell battery pack 1a of Samsung ICR18650-22P shows that a first (total) charge time and a second (total) charge time in the first time and the second charging cycles are 1.35 hours and 2.86 hours, respectively. Clearly, 1.35 hours and 2.86 hours are both far lower than the pre-determined charge time, implying that that method disclosed by the U.S. Pat. No. 8,035,343 merely considers the charging current regulation, but fails to make good use of the pre-determined charge time.

From above descriptions, it is understood that there are still rooms for improvement in the conventional the multi-cell battery pack 1a and the method disclosed by the U.S. Pat. No. 8,035,343. In view of that, inventors of the present application have made great efforts to make inventive research and eventually provided a device and method for achieving dynamic charging and balance of battery cells.

SUMMARY OF THE INVENTION

The primary objective of the present invention is to disclose a device for achieving dynamic charging and balance of battery cells. The device is implemented in a multi-cell battery pack comprising a plurality of battery cells and a battery management circuit. According to the present invention, the device is configured for monitoring a plurality of battery voltages from the plurality of battery cells. In case of a battery voltage difference between any two of the battery cells being greater than a pre-determined voltage difference, the device generates a plurality of balance charging currents for charging the battery cells. In which, each of the balance charging currents is calculated based on remaining charge time, measured battery voltage, and rated battery capacity. Thus, in a charge cycle, one balance charging current for charging one battery cell with low battery voltage is designed to be greater than another one balance charging current for charging another one battery cell with high battery voltage. Consequently, elimination of the battery voltage difference that exists between any two of the battery cells is achieved, thereby simultaneously achieving the balance of the plurality of battery cells of the multi-cell battery pack.

In order to achieve the primary objective of the present invention, inventors of the present invention provides an embodiment of the device for achieving dynamic charging and balance of battery cells, which is applied in a multi-cell battery pack that comprises a plurality of battery cells and a battery management circuit. The device is integrated in the battery management circuit, and comprises:

a battery voltage sensing unit, being coupled to the plurality of battery cells, so as to apply a battery voltage detection to each of the plurality of battery cells, thereby outputting a plurality of voltage sensing signals; and a battery balancing module, being coupled to the battery voltage sensing unit to receive the plurality of voltage sensing signals, and being also coupled to a controller unit of the battery management circuit; wherein the battery balancing module comprises:

a first signal processing unit for converting the plurality of voltage sensing signals to a plurality of battery voltages; and a balance executing unit, being coupled to the first signal processing unit for receiving the plurality of battery voltages, and being configured to generates a plurality of balance charging currents for charging the plurality of battery cells of the multi-cell battery pack;

wherein an intensity of each of the balance charging currents is calculated based on a target battery voltage, a remaining charge time, the battery voltage, and a rated battery capacity.

In one embodiment, the device according to the present invention further comprises:

a charging current sensing unit, being coupled to the controller unit of the battery management circuit, so as to apply a current detection to a charging current that is transmitted from the controller unit to the multi-cell battery pack, thereby generating a charging current sensing signal.

In one embodiment, the battery balancing module further comprises:

a second signal processing unit, being coupled to the charging current sensing unit for receiving the charging current sensing signal, so as to convert the charging current sensing signal to a charging current; wherein the second signal processing unit is also coupled to the balance executing unit, such that the balance executing unit acquires an intensity of the charging current from the second signal processing unit; and a time counter, being coupled to the balance executing unit, and being adopted for counting a passing charge time of the battery cell, such that the balance executing unit calculates the remaining charge time according to a pre-determined charge time and the passing charge time that is acquired from the time counter.

In one practicable embodiment, the battery balancing module 134 further comprises:

a storage unit, being coupled to the balance executing unit, and storing with a plurality of setting parameters, wherein the plurality of setting parameters comprises: the pre-determined charge time, the target battery voltage and the rated battery capacity.

In one embodiment, the balance executing unit utilizes following mathematical formula to complete a calculation of the balance charging current:

$$I_B = B_C * \frac{V_{target} - V_{cell}}{K * T_C}; \quad (I)$$

wherein K is a scale coefficient, $I_B$ is the balance charging current, $B_C$ is the rated battery capacity, $V_{target}$ is the target battery voltage, $V_{cell}$ is the battery voltage, and $T_C$ is the remaining charge time.

In another one embodiment, the balance executing unit utilizes following mathematical formula to complete a calculation of the balance charging current:

$$I_B = \frac{B_C}{2} * \sqrt{\frac{V_{target} - V_{cell}}{K * T_C}}; \quad (II)$$

wherein K is a scale coefficient, $I_B$ is the balance charging current, $B_C$ is the rated battery capacity, $V_{target}$ is the target battery voltage, $V_{cell}$ is the battery voltage, and $T_C$ is the remaining charge time.

In one practicable embodiment, the battery management circuit is configured to further perform a plurality of functions of temperature sensing, overcharge protection, overdischarge protection, overcurrent protection, short circuit protection, and charge time protection.

In one embodiment, in case of the balance charging current being greater than a maximum charging current, the balance executing unit down-regulates an intensity of the balance charging current to be equal to an intensity of the maximum charging current. Moreover, in case of the balance charging current being greater than a minimum charging current, the balance executing unit up-regulates an intensity of the balance charging current to be equal to an intensity of the minimum charging current.

The present invention also discloses a method for achieving dynamic charging and balance of battery cells, which is executed by a battery balancing module. In which, a multi-cell battery pack comprises a plurality of battery cells and a battery management circuit, and the battery balancing module is integrated in the battery management circuit.

The method according to the present invention comprises steps of:

(1) controlling a voltage sensing unit to apply a battery voltage detection to each of the plurality of battery cells, thereby acquiring a plurality of battery voltages corresponding to the plurality of battery cells; (2) starting a battery voltage balancing treatment for the multi-cell battery pack in case of there being any two of the plurality of battery cells having a battery voltage difference that is greater than an upper threshold value;

(3) generating a plurality of balance charging currents for charging the plurality of battery cells of the multi-cell battery pack; wherein an intensity of each of the plurality of balance charging currents is calculated based on a target battery voltage, a remaining charge time, the battery voltage, and a rated battery capacity; and (4) repeatedly executing the forgoing steps (1)-(3), and then stopping battery voltage balancing treatment for the multi-cell battery pack in case of the battery voltage difference is down-regulated to be less than a lower threshold value.

Moreover, the present invention further discloses a rechargeable battery device, which comprises a multi-cell battery pack that comprises a plurality of battery cells and a battery management circuit, and which is characterized in that there is a battery balancing module integrated in the battery management circuit for executing the forgoing method according to the present invention.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a device and method for achieving dynamic charging and balance of battery cells disclosed by the present invention, embodiments of the present invention will be described in detail with reference to the attached drawings hereinafter.

Figure 1:
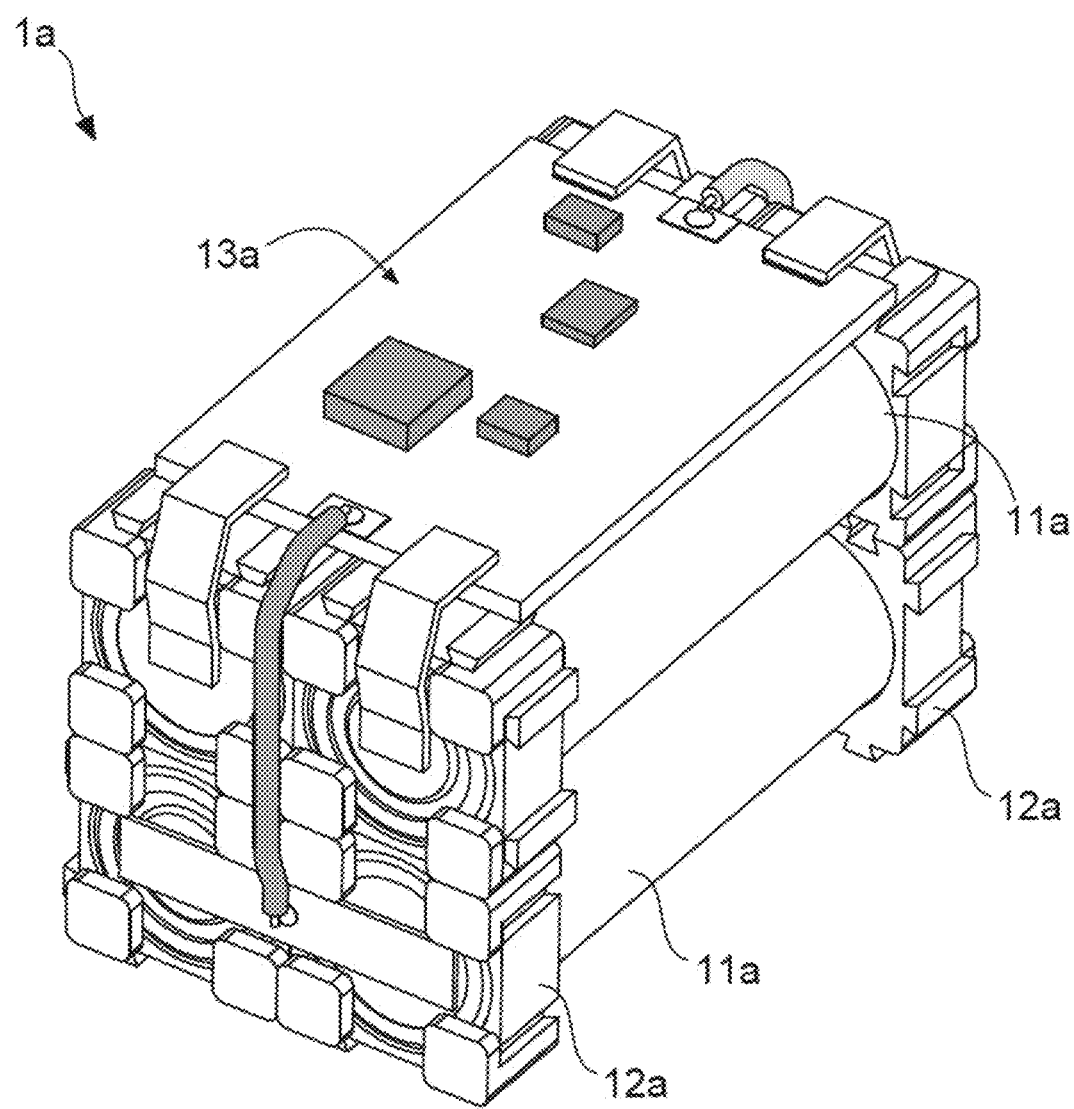
FIG. 1 shows a stereo diagram of a conventional multi-cell battery pack.
Figure 2:
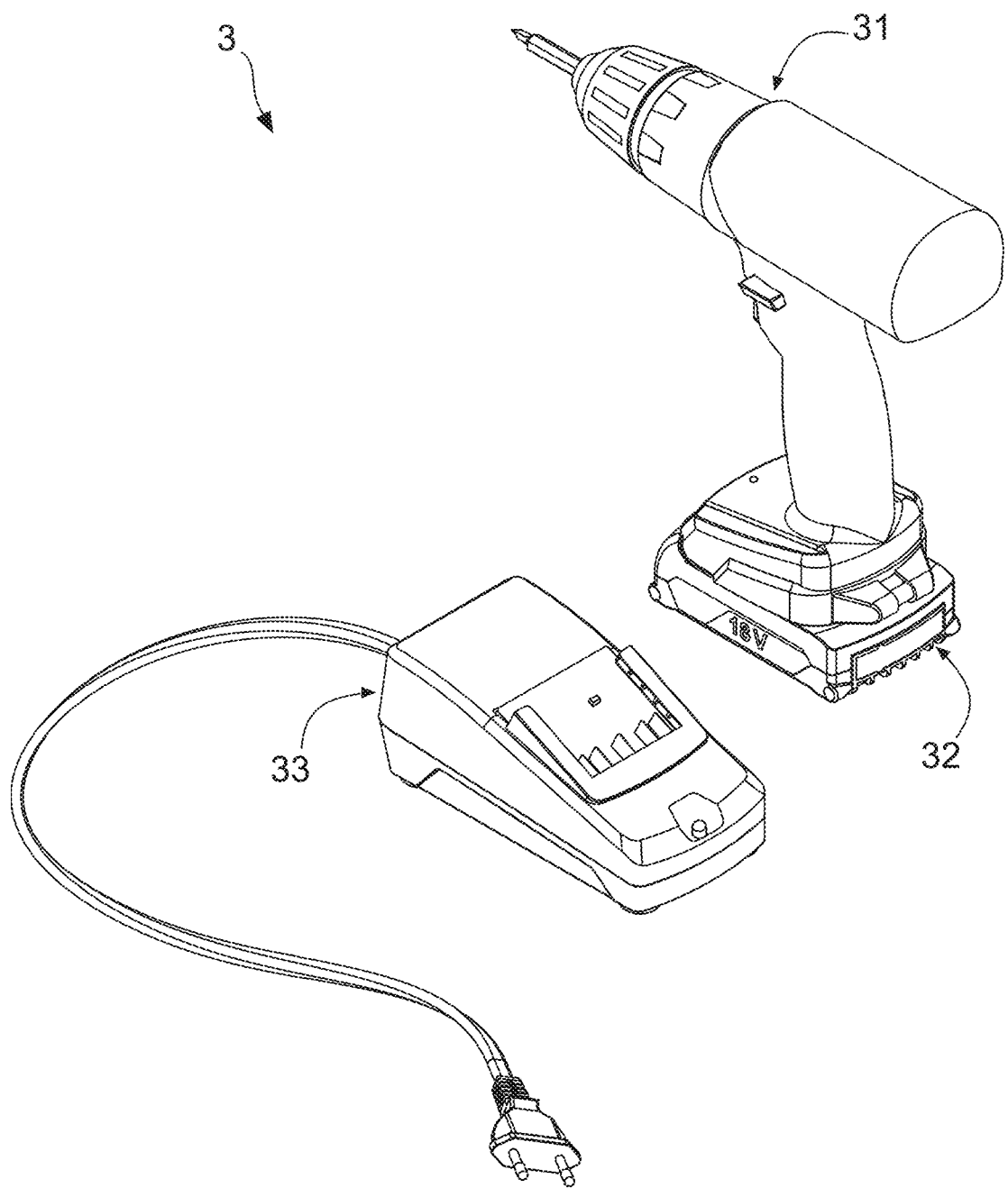
FIG. 2 shows a stereo diagram of a cordless electrical product.
Figure 3:
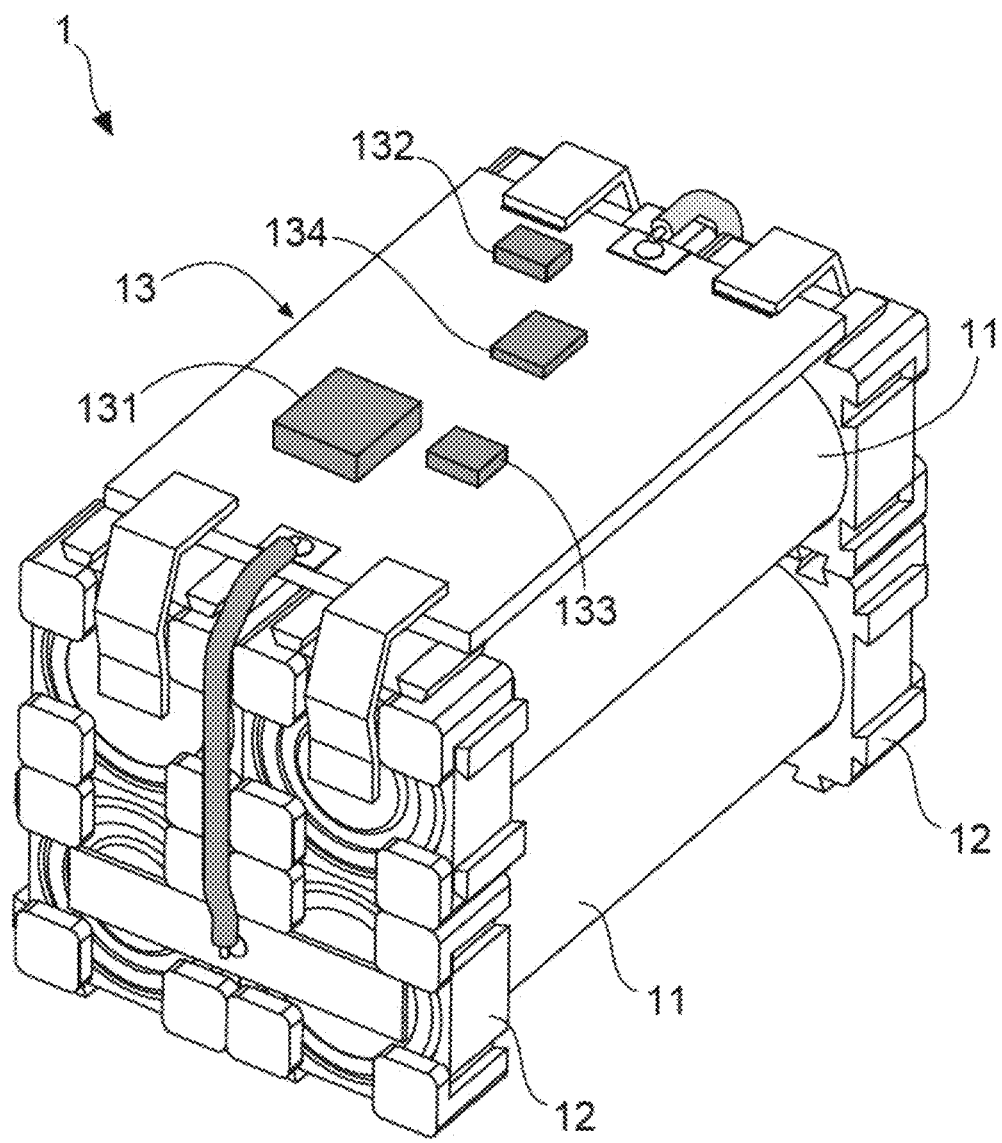
FIG. 3 shows a stereo diagram of a multi-cell battery pack for use in a rechargeable battery device of the cordless electrical product.

With reference to FIG. 2, there is shown a stereo diagram of a cordless electrical product. As FIG. 2 shows, the cordless electrical product 3 is a power tool, and comprises a main body 31, a rechargeable battery device 32 and a charging device 33. Moreover, FIG. 3 shows a stereo diagram of a multi-cell battery pack for use in the rechargeable battery device 32 depicted in FIG. 2. In practical use, the multi-cell battery pack 1 is accommodated in a housing so as to form the rechargeable battery device 32, and then the rechargeable battery device 32 is connected to the main body 31 of the cordless electrical product 3 for supplying power to a motor and/or electronic components that are disposed in the main body 31. It should be known that, besides being widely used in power supply of the cordless electrical products, the multi-cell battery pack 1 can also be applied in manufacture of the battery system of electric vehicle and electric scooter.

Figure 4:
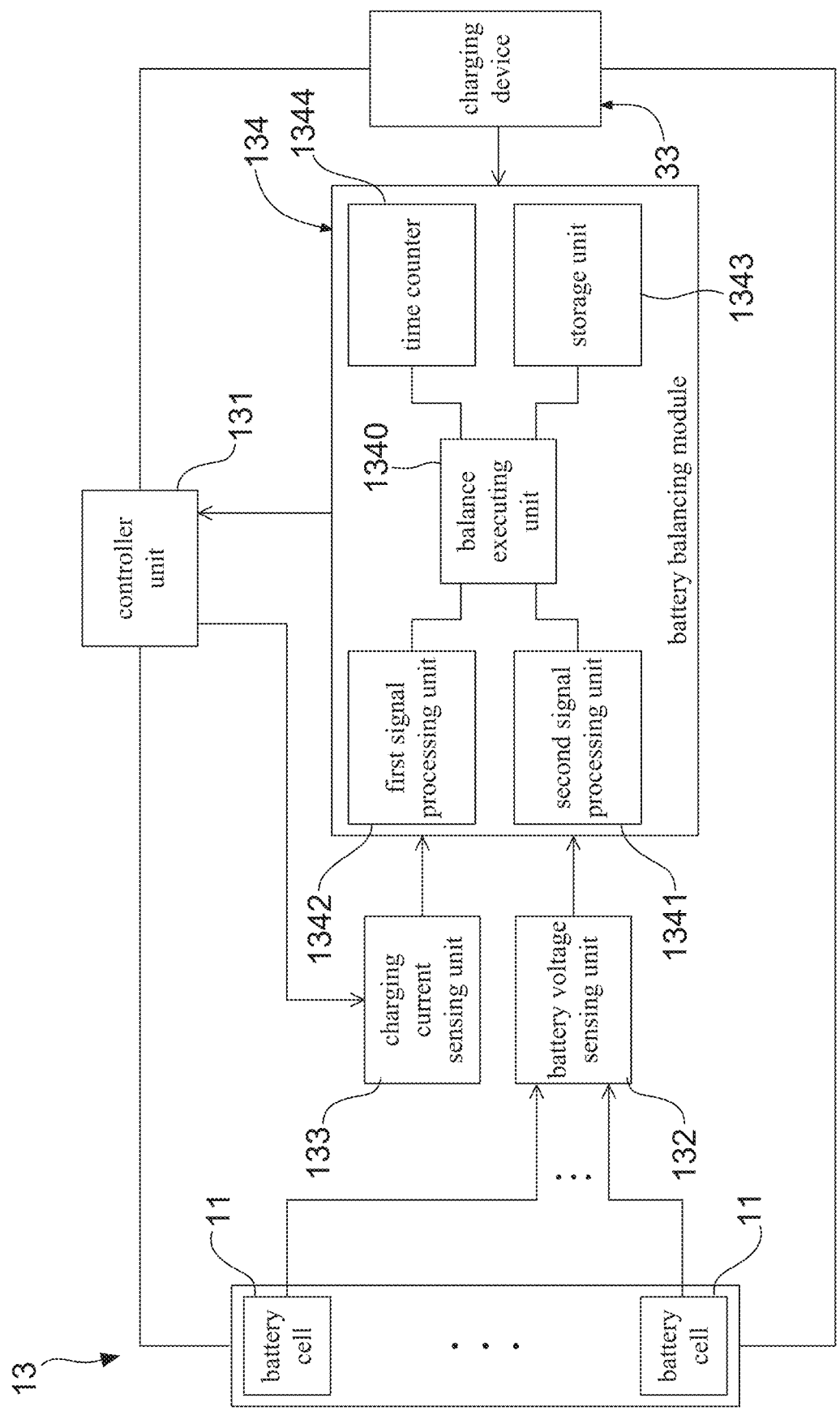
FIG. 4 shows a block diagram of a device for achieving dynamic charging and balance of battery cells according to the present invention.

As FIG. 3 shows, the multi-cell battery pack 1 principally comprises: a plurality of battery cells 11, a plurality of battery holders 12 and a battery management circuit 13. It is worth noting that, the present invention discloses a device for achieving dynamic charging and balance of battery cells, and the device is integrated in the battery management circuit 13 of the multi-cell battery pack 1. FIG. 4 shows a block diagram of a device for achieving dynamic charging and balance of battery cells according to the present invention. As FIG. 3 and FIG. 4 show, the battery management circuit 13 has a controller unit 131 for use in management the charging and the discharging of the battery cells 11. As described in more detail below, the device according to the present invention comprises: a battery voltage sensing unit 132, a charging current sensing unit 133 and a battery balancing module 134, wherein the battery voltage sensing unit 132 is coupled to the battery cells 11, so as to apply a battery voltage detection to each of the battery cells 11, thereby outputting a plurality of voltage sensing signals.

When the rechargeable battery device 32 using the multi-cell battery pack 1 is in a low capacity state or is going to run down, it needs to use the charging device 33 to charge the rechargeable battery device 32. During the charging of the rechargeable battery device 32, the charge device generates a constant charging current, such that the controller unit 131 of the battery management circuit 13 transmits the charging current to each of the battery cells 11. From FIG. 3 and FIG. 4, it is understood that the charging current sensing unit 133 is coupled to the controller unit 131, so as to apply a current detection to the (constant) charging current that is transmitted from the controller unit 131 to the multi-cell battery pack 1, thereby generating a charging current sensing signal.

As described in more detail below, the battery balancing module 134 is coupled to the controller unit 131, the battery voltage sensing unit 132 and the charging current sensing unit 133, and comprises: a first signal processing unit 1341, a second signal processing unit 1342, a storage unit 1343, a time counter 1344, and a balance executing unit 1340. In which, the first signal processing unit 1341 is coupled to the battery voltage sensing unit 132 to receive a plurality of voltage sensing signals, thereby converting the plurality of voltage sensing signals to the plurality of battery voltages. On the other hand, the second signal processing unit 1342 is coupled to the charging current sensing unit 133 for receiving the charging current sensing signal, so as to convert the charging current sensing signal to a charging current. FIG. 4 also depicts that, the balance executing unit 1340 is coupled to the first signal processing unit 1341 for receiving the plurality of battery voltages, and is also is coupled to the second signal processing unit 1342 so as to acquire an intensity of the charging current.

According to the present invention, the balance executing unit 1340 is configured for starting to apply a battery voltage balancing treatment for the multi-cell battery pack 1 in case of there being any two of the plurality of battery cells 11 having a battery voltage difference that is greater than an upper threshold value. During the execution of the battery voltage balancing treatment, the balance executing unit 1340 firstly generates a plurality of balance charging currents, and then utilizes the balance charging currents to charge the battery cells 11 of the multi-cell battery pack 1 for a number of times of charging cycles. In each of the charging cycles, each balance charging current's intensity is calculated based on a target battery voltage, a remaining charge time, the battery voltage (detected by battery voltage sensing unit 132), and a rated battery capacity (of the battery cell).

Commercial battery management circuit 13 is commonly configured to further perform a plurality of functions, including: temperature sensing, overcharge protection, over-discharge protection, overcurrent protection, short circuit protection, and charge time protection. Therefore, during the charging of the multi-cell battery pack 1, the management circuit 13 stops charging the multi-cell battery pack 1 in case of a total charge time of the multi-cell battery pack 1 being over a pre-determined charge time (e.g., 7 hours, by the intensity of the constant charging current). According to the present invention, the so-called remaining charge time can be calculated by subtracting a passing charge time from the pre-determined charge time. Accordingly, as FIG. 4 shows, the time counter 1344 is coupled to the balance executing unit 1340, and is adopted for counting a passing charge time of the battery cell 11, such that the balance executing unit 1340 calculates the remaining charge time according to a pre-determined charge time and the passing charge time that is acquired from the time counter 1344.

Moreover, the storage unit 1343 is coupled to the balance executing unit 1340, and stores with a plurality of setting parameters, wherein the plurality of setting parameters comprises: the pre-determined charge time, the target battery voltage and the rated battery capacity. Thus, during the execution of the battery voltage balancing treatment, the balance executing unit 1340 generates a plurality of balance charging currents in each of the charging cycles, according to the target battery voltage, the remaining charge time, the battery voltage, and the rated battery capacity.

As described in more detail below, the balance executing unit 1340 utilizes following mathematical formula (I) or (II) to complete a calculation of the balance charging current:

$$I_B = B_C * \frac{V_{target} - V_{cell}}{K * T_C} \quad (I)$$

$$I_B = B_C * \frac{V_{target} - V_{cell}}{K * T_C} \quad (I)$$

In the forgoing two mathematical formulas, K is a scale coefficient, $I_B$ is the balance charging current, $B_C$ is the rated battery capacity, $V_{target}$ is the target battery voltage, $V_{cell}$ is the battery voltage, and $T_C$ is the remaining charge time. According to the present invention, the balance executing unit 1340 down-regulates the intensity of the balance charging current to be equal to that of the maximum charging current (e.g., 450 mA) in case of the balance charging current being greater than a maximum charging current. On the other hand, in case of the balance charging current being greater than a minimum charging current (e.g., 45 mA or 140 mA), the balance executing unit 1340 up-regulates an intensity of the balance charging current to be equal to an intensity of the minimum charging current.

For example, it is able to take Samsung ICR18650-22P consisting of 22 pieces of 18650 lithium-ion rechargeable battery cells as a sample of the multi-cell battery pack 1, and then set a target battery voltage, a maximum charging current and a minimum charging current to be 4.3V, 450 mA and 45 mA, respectively. Please refer to following Table (2), which lists the balance charging currents generated by the balance executing unit 1340 in difference charging cycles, based on different remaining charge time and battery voltages. It needs to further explain that the rated battery capacity of the battery cell (11) is 2200 mA/h, and the balance charging currents listed in following Table (2) are calculated by using the mathematical formula (I).

TABLE 2

|  | 6 hrs | 5 hrs | 4 hrs | 3 hrs | 2 hrs | 1 hr |
|---|---|---|---|---|---|---|
| 3.2 V | 403.3 mA | 450.0 mA | 450.0 mA | 450.0 mA | 450.0 mA | 450.0 mA |
| 3.3 V | 366.7 mA | 440.0 mA | 450.0 mA | 450.0 mA | 450.0 mA | 450.0 mA |
| 3.4 V | 330.0 mA | 396.0 mA | 450.0 mA | 450.0 mA | 450.0 mA | 450.0 mA |
| 3.5 V | 293.3 mA | 352.0 mA | 440.0 mA | 450.0 mA | 450.0 mA | 450.0 mA |
| 3.6 V | 256.7 mA | 308.0 mA | 385.0 mA | 450.0 mA | 450.0 mA | 450.0 mA |
| 3.7 V | 220.0 mA | 264.0 mA | 330.0 mA | 440.0 mA | 450.0 mA | 450.0 mA |
| 3.8 V | 183.3 mA | 220.0 mA | 275.0 mA | 366.7 mA | 450.0 mA | 450.0 mA |
| 3.9 V | 146.7 mA | 176.0 mA | 220.0 mA | 293.3 mA | 440.0 mA | 450.0 mA |
| 4.0 V | 110.0 mA | 132.0 mA | 165.0 mA | 220.0 mA | 330.0 mA | 450.0 mA |
| 4.1 V | 73.3 mA | 88.0 mA | 110.0 mA | 146.7 mA | 220.0 mA | 440.0 mA |
| 4.2 V | 45.0 mA | 45.0 mA | 55.0 mA | 73.3 mA | 110.0 mA | 220.0 mA |

Figure 5:
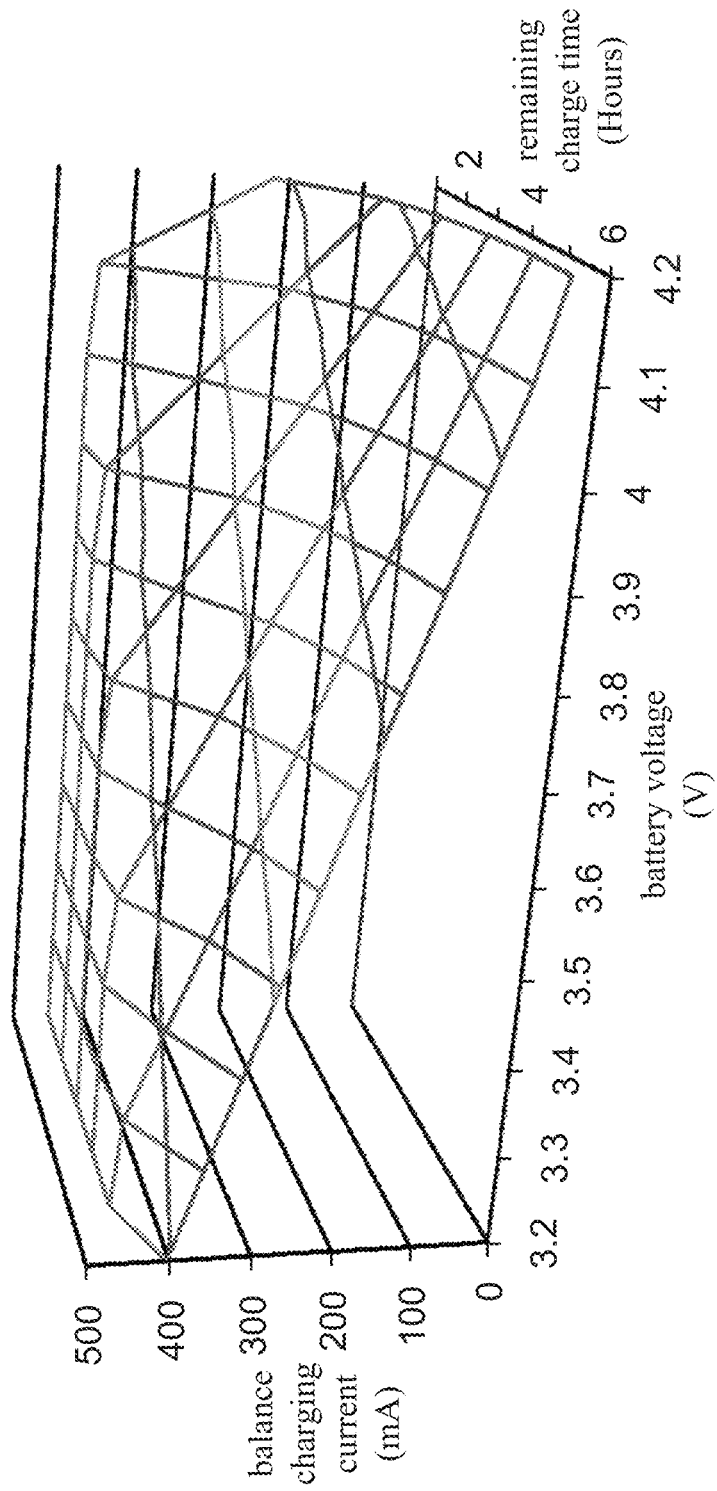
FIG. 5 shows a 3D surface plot produced according to data of Table (2)

FIG. 5 shows a 3D surface plot produced according to data of Table (2). From FIG. 5, it is clear that the balance charging current correlates with the battery voltages measured by battery voltage sensing unit 132 and the remaining charge time because the target battery voltage and the rated battery capacity are both a pre-determined value. In other words, the battery balancing module 134 utilizes different balance charging currents to achieve a dynamic charging of the multi-cell battery pack 1 in every charge cycle. Thus, every charge cycle, one balance charging current for charging one battery cell 11 with low battery voltage is designed to be greater than another one balance charging current for charging another the battery cell 11 with high battery voltage. Consequently, elimination of the battery voltage difference that exists between any two of the battery cells 11 is achieved, thereby accomplishing the (battery voltage) balance of the plurality of battery cells 11 of the multi-cell battery pack 1.

On the other hand, it can also take Samsung ICR18650-22P consisting of 22 pieces of 18650 lithium-ion rechargeable battery cells as a sample of the multi-cell battery pack 1, and then set a target battery voltage, a maximum charging current and a minimum charging current to be 4.3V, 450 mA and 140 mA, respectively. Please refer to following Table (3), which lists the balance charging currents generated by the balance executing unit 1340 in difference charging cycles, based on different remaining charge time and battery voltages. It needs to further explain that the rated battery capacity of the battery cell 11 is 2200 mA/h, and the balance charging currents listed in following Table (3) are calculated by using the mathematical formula (I).

TABLE 3

|  | 6 hrs | 5 hrs | 4 hrs | 3 hrs | 2 hrs | 1 hr |
|---|---|---|---|---|---|---|
| 3.2 V | 450 mA | 450.0 mA | 450.0 mA | 450.0 mA | 450.0 mA | 450.0 mA |
| 3.3 V | 449.1 Ma | 450.0 mA | 450.0 mA | 450.0 mA | 450.0 mA | 450.0 mA |
| 3.4 V | 429.0 mA | 450.0 mA | 450.0 mA | 450.0 mA | 450.0 mA | 450.0 mA |
| 3.5 V | 401.7 mA | 440.0 mA | 450.0 mA | 450.0 mA | 450.0 mA | 450.0 mA |
| 3.6 V | 375.7 mA | 411.6 mA | 450.0 mA | 450.0 mA | 450.0 mA | 450.0 mA |
| 3.7 V | 347.9 mA | 381.1 mA | 426.0 mA | 450.0 mA | 450.0 mA | 450.0 mA |
| 3.8 V | 317.5 mA | 347.9 mA | 388.9 mA | 449.1 mA | 450.0 mA | 450.0 mA |
| 3.9 V | 284.0 mA | 311.1 mA | 347.9 mA | 401.7 mA | 450.0 mA | 450.0 mA |
| 4.0 V | 246.0 mA | 269.4 mA | 301.2 mA | 347.9 mA | 426.0 mA | 450.0 mA |
| 4.1 V | 200.8 mA | 220.0 mA | 246.0 mA | 284.0 mA | 347.9 mA | 450.0 mA |
| 4.2 V | 142.0 mA | 155.6 mA | 173.9 mA | 200.8 mA | 246.0 mA | 347.9 mA |

Figure 6:
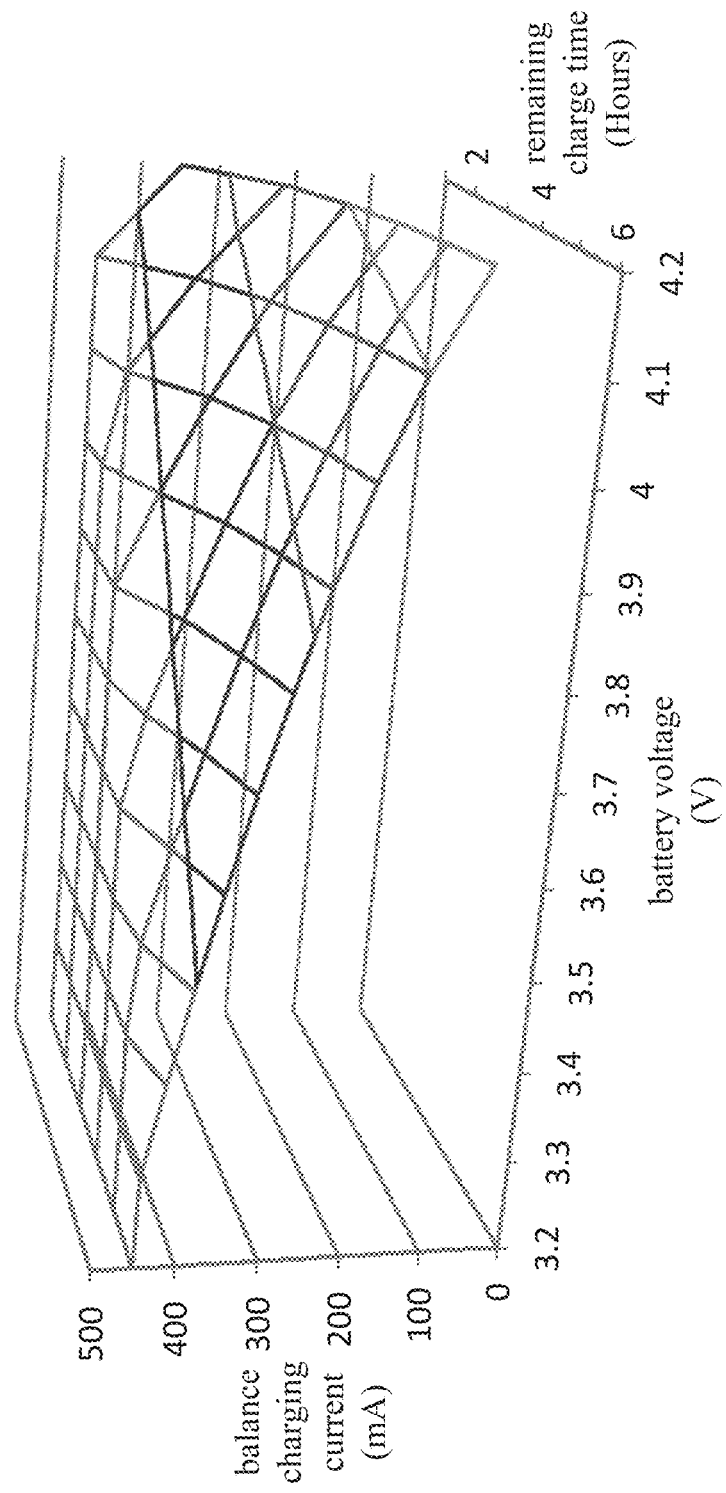
FIG. 6 shows a 3D surface plot produced according to data of Table (3)

FIG. 6 shows a 3D surface plot produced according to data of Table (3). From FIG. 6, it is clear that the balance charging current correlates with the battery voltages measured by battery voltage sensing unit 132 and the remaining charge time because the target battery voltage and the rated battery capacity are both a pre-determined value. In other words, the battery balancing module 134 utilizes different balance charging currents to achieve a dynamic charging of the multi-cell battery pack 1 in every charge cycle. Thus, every charge cycle, one balance charging current for charging one battery cell 11 with low battery voltage is designed to be greater than another one balance charging current for charging another the battery cell 11 with high battery voltage. Consequently, elimination of the battery voltage difference that exists between any two of the battery cells 11 is achieved, thereby accomplishing the (battery voltage) balance of the plurality of battery cells 11 of the multi-cell battery pack 1.

Figure 7:
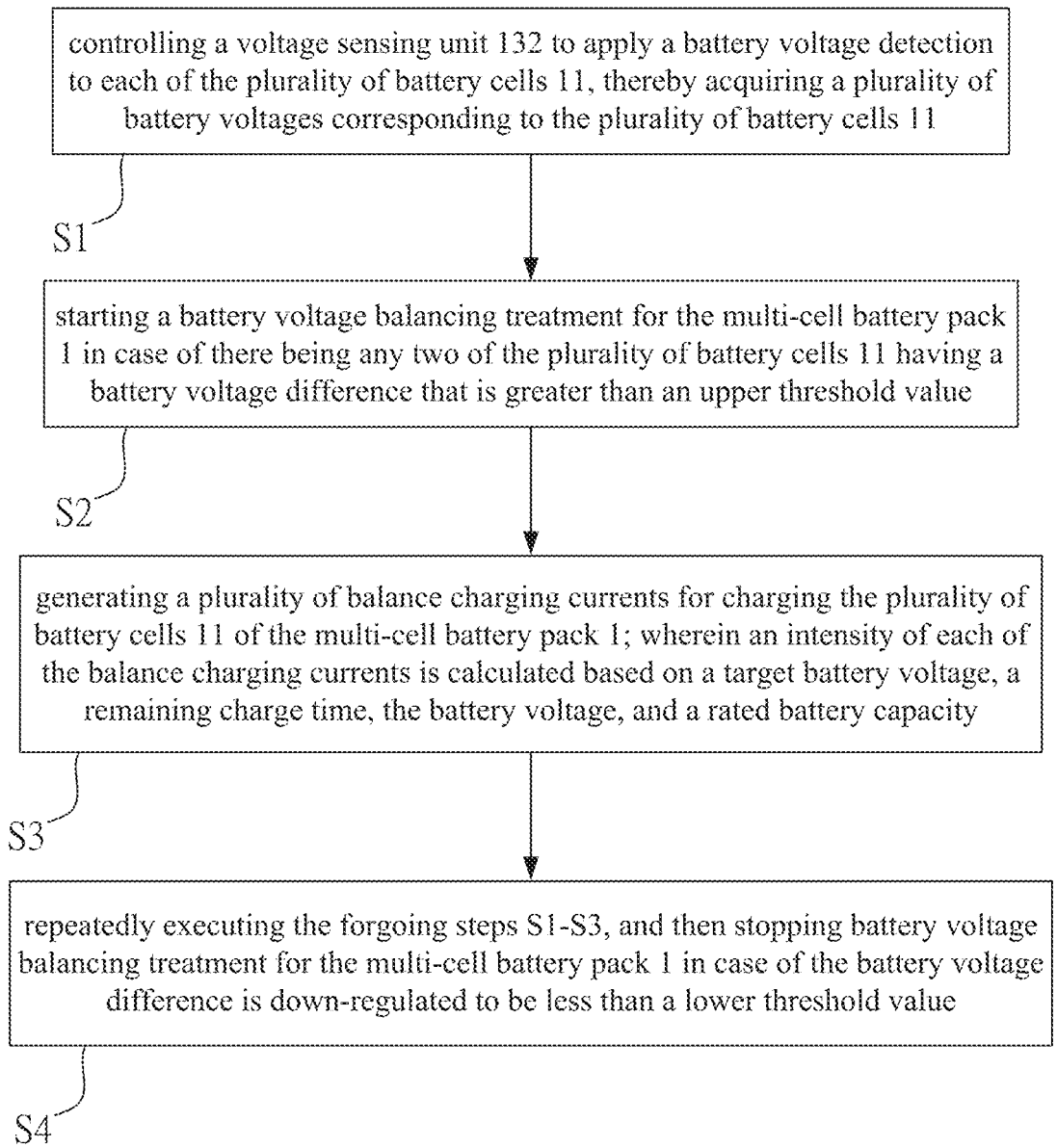
FIG. 7 shows a flow chart of a method for achieving dynamic charging and balance of battery cells according to the present invention.

Thus through above descriptions, all embodiments and their constituting elements of the device for achieving dynamic charging and balance of battery cells according to the present invention have been introduced completely. Furthermore, the present invention also discloses a method for achieving dynamic charging and balance of battery cells, which is executed by a battery balancing module 134 (as shown in FIG. 3 and FIG. 4). In which, a multi-cell battery pack 1 comprises a plurality of battery cells 11 and a battery management circuit 13, and the battery balancing module 134 is integrated in the battery management circuit 13. FIG. 7 shows a flow chart of a method for achieving dynamic charging and balance of battery cells according to the present invention. As FIG. 7 shows, the method flow is firstly proceeded to step S1, so as to control a voltage sensing unit 132 to apply a battery voltage detection to each of the plurality of battery cells 11, thereby acquiring a plurality of battery voltages corresponding to the plurality of battery cells 11. Next, the method flow proceeds to step S2. During step S2, the battery balancing module 134 starts to execute a battery voltage balancing treatment for the multi-cell battery pack 1 in case of there being any two of the plurality of battery cells 11 having a battery voltage difference that is greater than an upper threshold value.

As FIG. 3, FIG. 4 and FIG. 7 show, the method flow next proceeds to step S3, so as to generate a plurality of balance charging currents for charging the plurality of battery cells 11 of the multi-cell battery pack 1. In which, an intensity of each of the plurality of balance charging currents is calculated based on the target battery voltage, the remaining charge time, the battery voltage, and the rated battery capacity. Consequently, the method flow is proceeded to step S4, so as to repeatedly execute the forgoing steps S1-S3, and then stopping battery voltage balancing treatment for the multi-cell battery pack 1 in case of the battery voltage difference is down-regulated to be less than a lower threshold value.

After the Samsung ICR18650-22P (i.e., a sample of the multi-cell battery pack 1) is applied with the battery voltage balancing treatment, related experimental data have been recorded in following Table (4). From Table (4), it is found that the balance executing unit 1340 accomplished the (battery voltage) balance of the 22 pieces of battery cells 11 of the Samsung ICR18650-22P by 6 times of charge cycles. Moreover, experiment data of the multi-cell battery pack 1 (Samsung ICR18650-22P) shows that a first (total) charge time and a second (total) charge time in the first time and the second charging cycles are 3.25 hours and 4.76 hours, respectively. Clearly, 3.25 hours and 4.76 hours are both just a little bit lower than the pre-determined charge time (e.g., 6 hours), implying that that method disclosed by the present invention also make good use of the pre-determined charge time.

TABLE 4

| Charging cycle | Maximum battery voltage of battery cell 11a (Vcell_MAX) | Minimum battery voltage of battery cell 11a (Vcell_MIN) | Charge time |
|---|---|---|---|
| Run1 (First time) | 3.95 V | 3.60 V | 3.25 hours |
| Run2 (Second time) | 3.77 V | 3.32 V | 4.76 hours |
| Run3 (Third time) | 3.70 V | 3.34 V | 5.18 hours |
| Run4 (Fourth time) | 3.68 V | 3.42 V | 5.42 hours |
| Run5 (Fifth time) | 3.58 V | 3.33 V | 5.81 hours |
| Run6 (Sixth time) | 3.5 V | 3.35 V | 6.03 hours |

Therefore, through above descriptions, all embodiments and their constituting elements of the device for achieving dynamic charging and balance of battery cells according to the present invention have been introduced completely and clearly. The above description is made on embodiments of the present invention. However, the embodiments are not intended to limit scope of the present invention, and all equivalent implementations or alterations within the spirit of the present invention still fall within the scope of the present invention.

What is claimed is:

1. A device for achieving dynamic charging and balance of battery cells, being applied in a multi-cell battery pack that comprises a plurality of battery cells and a battery management circuit, wherein each of the plurality of battery cells has a rated battery capacity, and the device is integrated in the battery management circuit; the device comprising:
a battery voltage sensing unit, being coupled to the plurality of battery cells, so as to apply a battery voltage detection to each of the plurality of battery cells, thereby outputting a plurality of voltage sensing signals; and
a battery balancing module, being coupled to the battery voltage sensing unit to receive the plurality of voltage sensing signals, and being also coupled to a controller unit of the battery management circuit; wherein the battery balancing module comprises:
a first signal processing unit for converting the plurality of voltage sensing signals to a plurality of battery voltages;
a balance executing unit, being coupled to the first signal processing unit for receiving the plurality of battery voltages, and being configured to generate a plurality of balance charging currents for charging the plurality of battery cells of the multi-cell battery pack; and
a time counter, being coupled to the balance executing unit, and being employed for conducting a time counting of the multi-cell battery pack while the multi-cell battery pack is charged by the plurality of balance charging currents, thereby outputting a time counting signal to the balance executing unit;
wherein the balance executing unit is configured to:
calculate, based on the time counting signal and a pre-determined charge limit time of the multi-cell battery pack, a remaining charge time of the multi-cell battery pack;
calculate, based on the remaining charge time, a target battery voltage, the plurality of battery voltages, and the rated battery capacity, the plurality of balance charging currents;
abate, in case of said balance charging current being greater than a pre-determined maximum charging current, said balance charging current to be equal to the pre-determined maximum charging current; and
enhance, in case of said balance charging current being lower than a pre-determined minimum charging current, said balance charging current to be equal to the pre-determined minimum charging current.

2. The device of claim 1, further comprising:
a charging current sensing unit, being coupled to the controller unit of the battery management circuit, so as to apply a current detection to a charging current that is transmitted from the controller unit to the multi-cell battery pack, thereby generating a charging current sensing signal.

3. The device of claim 2, wherein the battery balancing module further comprises:
a second signal processing unit, being coupled to the charging current sensing unit for receiving the charging current sensing signal, so as to convert the charging current sensing signal to a charging current; wherein the second signal processing unit is also coupled to the balance executing unit, such that the balance executing unit acquires an intensity of the charging current from the second signal processing unit.

4. The device of claim 3, wherein the battery balancing module further comprises:
a storage unit, being coupled to the balance executing unit, and storing with a plurality of setting parameters, wherein the plurality of setting parameters comprises: the pre-determined charge time, the target battery voltage and the rated battery capacity.

5. The device of claim 4, wherein the balance executing unit utilizes the following mathematical formula to complete a calculation of the balance charging current:

$$I_B = B_C * \frac{V_{target} - V_{cell}}{K * T_C}; \quad (I)$$

wherein K is a scale coefficient, $I_B$ being the balance charging current, $B_c$ being the rated battery capacity, $V_{target}$ being the target battery voltage, $V_{cell}$ being the battery voltage, and $T_c$ being the remaining charge timer.

6. The device of claim 4, wherein the balance executing unit utilizes the following mathematical formula to complete a calculation of the balance charging current:

$$I_B = \frac{B_C}{2} * \sqrt{\frac{V_{target} - V_{cell}}{K * T_C}}; \quad \text{(II)}$$

wherein K being a scale coefficient, $I_B$ being the balance charging current, $B_c$ being the rated battery capacity, $V_{target}$ being the target battery voltage, $V_{cell}$ being the battery voltage, and $T_c$ being the remaining charge time.

7. The device of claim 1, wherein the battery management circuit is configured to further perform a plurality of functions of temperature sensing, overcharge protection, overdischarge protection, overcurrent protection, short circuit protection, and charge time protection.

* * * * *